US006221726B1

(12) United States Patent
Weiner

(10) Patent No.: US 6,221,726 B1
(45) Date of Patent: Apr. 24, 2001

(54) PROCESS FOR FABRICATING DEVICE STRUCTURES FOR REAL-TIME PROCESS CONTROL OF SILICON DOPING

(75) Inventor: Kurt H. Weiner, San Jose, CA (US)

(73) Assignee: The Regents of the University of Claifornia, Oakland, CA (US)

( * ) Notice: Subject to any disclaimer, the term of this patent is extended or adjusted under 35 U.S.C. 154(b) by 705 days.

(21) Appl. No.: 08/548,928

(22) Filed: Oct. 26, 1995

(51) Int. Cl.$^7$ .................................. H01L 21/336
(52) U.S. Cl. ............................. 438/308; 438/535
(58) Field of Search ................................ 437/8, 170, 172, 437/174, 950; 148/DIG. 162; 438/16, 17, 308, 535, 795, 798

(56) References Cited

U.S. PATENT DOCUMENTS

| | | | | |
|---|---|---|---|---|
| 4,380,864 | * | 4/1983 | Das ....................................... | 437/170 |
| 4,646,426 | * | 3/1987 | Sasaki .................................. | 437/174 |
| 5,316,969 | * | 5/1994 | Ishida .................................. | 437/950 |
| 5,474,940 | * | 12/1995 | Tsakamoto ........................... | 437/174 |

* cited by examiner

Primary Examiner—Chandra Chaudhari
(74) Attorney, Agent, or Firm—Alan H. Thompson; L. E. Carnahan

(57) ABSTRACT

Silicon device structures designed to allow measurement of important doping process parameters immediately after the doping step has occurred. The test structures are processed through contact formation using standard semiconductor fabrication techniques. After the contacts have been formed, the structures are covered by an oxide layer and an aluminum layer. The aluminum layer is then patterned to expose the contact pads and selected regions of the silicon to be doped. Doping is then performed, and the whole structure is annealed with a pulsed excimer laser. But laser annealing, unlike standard annealing techniques, does not effect the aluminum contacts because the laser light is reflected by the aluminum. Once the annealing process is complete, the structures can be probed, using standard techniques, to ascertain data about the doping step. Analysis of the data can be used to determine probable yield reductions due to improper execution of the doping step and thus provide real-time feedback during integrated circuit fabrication.

19 Claims, No Drawings

PROCESS FOR FABRICATING DEVICE STRUCTURES FOR REAL-TIME PROCESS CONTROL OF SILICON DOPING

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention relates to the doping of silicon, particularly to the determination of proper silicon doping utilized in integrated circuit fabrication, and more particularly to silicon device structures for obtaining real-time feedback during integrated circuit fabrication relative to the doping operation.

A significant problem in the integrated circuit manufacturing industry is that of monitoring the results of each process step. The importance of real-time process monitoring for accurate decision-making during the fabrication sequence has given rise to an entire industry devoted to providing the equipment necessary to accomplish this task. Of all of the processing steps, one of the most critical is that of doping the silicon semiconductor. Of utmost importance during the doping process is to achieve uniformity of both junction depth and impurity dose both across the silicon wafer and from wafer to wafer. To monitor the uniformity of dopants in silicon, numerous diagnostic tools have been developed. However, none of these tools gives real-time feedback concerning the electrically active impurity dose and the junction depth. The present invention addresses this problem. Using newly designed test structures and a pulsed laser annealing technique, the invention enables the measurement, in real time, of the active impurity dose and junction depth of doped junctions formed by both ion implantation and gas immersion laser doping (GILD). Data obtained from the test structures can be utilized to determine dopant yield during the doping operation.

SUMMARY OF THE INVENTION

An object of the present invention is to monitor uniformity during doping of silicon.

A further object of the present invention is to provide means for determining uniformity of both junction depth and impurity dose in a silicon wafer, and a process for fabricating and utilizing such a means.

Another object of the invention is to enable measurement, in real time, of the active impurity dose and junction depth of doped junctions.

Another object of the invention is to provide device structures for real-time process control of silicon doping, and a process for fabrication and utilization thereof.

Another object of the invention is to enable dopant monitoring in silicon by a process involving the fabrication of test structures, which involves a patterned aluminum layer, pulsed laser annealing, and electrical measuring to determine the dose and depth of the impurities incorporated during the doping step.

Another object of the invention is to produce silicon test structures for obtaining real-time feedback during integrated circuit fabrication.

Other objects and advantages of the present invention will become apparent from the following description. The present invention involves device structures for real-time process control of silicon doping by providing doping process parameters immediately after the doping process has occurred. The test structures are processed through contact formation using standard semiconductor fabrication techniques. After forming the contacts, the structures are covered with oxide and aluminum, and the aluminum is then patterned to expose the contact pads and selected regions of the silicon to be doped. Doping is then performed, such as by ion implantation, gas immersion laser doping, etc. Following doping, the entire structure is annealed with a pulsed laser, such as an excimer laser, which has no effect on the aluminum contacts because laser light is reflected thereby. Once the annealing process is complete, the structures can be probed (electrically tested), using standard techniques, to ascertain important data. Analysis of the data is then used to determine probable yield reductions due to improper execution of the doping procedure. Different structures can be used to measure uniformity, dose, and junction depth of the doped regions. These structures can be used to obtain real-time feedback during integrated circuit fabrication and to better understand and thereby enhance yield of the doping operation.

DETAILED DESCRIPTION OF THE INVENTION

The present invention involves device structures for real-time process control of silicon doping and a process for fabricating and utilizing the structures. A principle feature of this invention is the use of an aluminum or other laser light reflective overlayer on nearly completed test structures routinely used for monitoring the junction depth, impurity dose, and electrical performance of solid state devices fabricated in silicon to allow subsequent laser annealing of the regions that are doped. Prior to the doping step to be monitored, silicon wafers containing an array of the appropriate test structures are processed using standard techniques. Virtually every part of the device is completed except for incorporation of dopants in the critical regions of the test structures. These regions actually provide the information on the doping process. Included in the steps used prior to the doping step is contact metallization. Proper "ohmic" contact to the silicon wafer is paramount to obtaining accurate data from the test device. The ohmic contacts are formed by creating small doped regions that extend several thousand angstroms into the silicon. These regions are then metallized first with titanium, then with pure aluminum. Following the metallization, the contacts are sintered in a furnace to provide the lowest resistance contacts to the test structures. The doped regions in the silicon actually extend beyond the metals used for the contacts and serve as a bridge to the regions that will be doped later.

After contact metallization has been performed, an insulating layer of oxide, such as silicon dioxide, is placed over the silicon wafer; and then a layer of pure aluminum is deposited on the insulating layer. The oxide and aluminum are then patterned to open up holes therein to the underlying contacts and to the critical silicon regions to be doped. At this point the devices are ready to be doped using either GILD or ion implantation. If ion implantation is used, the devices need to be excimer laser annealed. Since the aluminum reflects the laser light during the GILD and laser annealing steps, the underlying structures (contacts) are not adversely affected as a result of the dopant activation step. Once the annealing is completed, the device characteristics can be measured electrically to determine the dose and depth of the impurities incorporated during the doping step. The test device structure produced by this invention enables measurement of doping process parameters immediately after the doping step has occurred.

These test structures can be used to obtain real-time feedback during integrated circuit fabrication. Different test structures can be used to measure uniformity, dose, and junction depth of the doped regions. Analysis of the data can be used to determine probable yield reductions due to improper execution of the doping step. The process of this invention can be used in manufacturing facilities to better understand and thereby enhance yield of the doping step.

The following example sets forth the process of the present invention after the silicon test structures are processed through contact formation using standard semiconductor fabrication techniques, as described above, and having an exposed surface of the contacts made of aluminum:

1. Following formation of contacts in the silicon wafer, an electrically insulating (oxide) layer is deposited on the structure, which may be composed of silicon dioxide, or silicon nitride. The insulating layer may be deposited by known techniques, such as chemical vapor deposition (CVD) or plasma enhanced chemical vapor deposition (PECVD) to a thickness of 100 nm to 7 $\mu$m. Using silicon dioxide as the insulating layer, a thickness of 500 nm is preferred.

2. A layer of laser light reflective material, such as aluminum, titanium or molybdenum, is deposited on the insulating layer. Where aluminum is used, it is deposited by known techniques, such as physical vapor deposition (PVD) or electron-beam evaporation, to a thickness of 100 nm to 1 $\mu$m, preferably 500 nm.

3. The insulating and light reflective material are patterned to provide openings therein to the underlying contacts and critical silicon regions to be doped. This may be accomplished by standard optical lithography techniques in which a photoresist layer is deposited, patterned using a lithographic stepper and developed to form openings in the photoresist over the contacts. The aluminum is thin etched using a plasma or wet etch. Following aluminum etch the oxide is etched using plasma or wet chemical techniques. After these etchings, the photoresist is removed from the wafer.

4. The thus patterned device is then doped using either gas immersion laser doping (GILD) or ion implantation:

a) GILD is carried out as follows: The device is immersed in a dopant gas such as boron trifluoride, phosphorus pentafluoride, or arsenic pentafluoride. It is then exposed by an excimer laser operating at 308 nm. The energy fluence varies from 0.7 to 2.0 J/cm$^2$. The number of pulses varies from 1 to 500. The laser energy melts the silicon not covered by aluminum and dopants from the gas diffuse in and are incorporated into the silicon lattice when the molten region refreezes or recrystallizes.

b) Ion implantation is carried out as follows: The device is implanted with ions of boron, phsophorous, or arsenic at energies which range from 1–800 keV. The implanted dopants are annealed using a pulsed laser with a wavelength that is not strongly absorbed by the metal protective layer. The laser melts the silicon to a depth greater than the implant damage. Typical fluences for a UV excimer laser range from 0.7 to 2.0 J/cm$^2$. Only one (1) laser pulse is necessary to activate the dopants.

Once laser annealing is completed, the thus produced characteristics of the test device structure (uniformity of both junction depth and impurity dose) can be measured electrically. Briefly, this is accomplished by probing the device and passing the appropriate currents and voltages on the contact terminals. Typical test structures might include Hall structures for dose measurements and pinch resistors for junction depth measurements.

By the use of the above-described test structures and a pulsed laser annealing technique, one is able to measure, in real time, the activity impurity dose and junction depths of junctions formed by either ion implantation or GILD. This is accomplished primarily by the use of a patterned aluminum, for example, overlayer, by which doping in selected silicon regions can be accomplished without any dopant created adverse effects on the contacts, since the material of contacts (aluminum) reflect laser light. Where the contacts do not include an outer layer of aluminum or other laser light reflective material, a layer of aluminum will be deposited on the contacts prior to depositing the oxide layer, or the aluminum layer is not patterned to open up holes to the contacts.

The laser, in addition to being an excimer laser, may be a copper vapor laser or a YAG laser, using a pulse duration of 1 ns to 1 $\mu$s, energy of 0.6 to 5 J/cm$^2$, wavelength of 193 to 560 nm and pulses numbering from 1 to 500.

It has thus been shown that the present invention provides a new class of silicon device test structures designed in such a manner as to allow measurement of important doping process parameters immediately after the doping step has occurred. Following or during the doping step, the whole structure is annealed by pulsed laser energy, rather than standard annealing techniques, because pulsed laser annealing does not effect the aluminum contacts.

While a particular embodiment, process sequence, parameters, materials, etc. have been set forth to exemplify the invention and explain its principles, such are not intended to be limiting. Modifications and changes may become apparent to those skilled in the art, and it is intended that the invention be limited only by the scope of the appended claims.

The invention claimed is:

1. In a method for fabricating a silicon doping test structure having at least one contact therein, the improvement comprising:

providing a patterned overlayer of laser light reflective material having holes in alignment with said at least one contact and with regions of the silicon to be doped.

2. The improvement of claim 1, additionally including providing an insulating layer beneath the overlayer of laser light reflective material.

3. The improvement of claim 2, wherein providing said insulating layer is carried out using material composed of silicon dioxide or silicon nitride.

4. The improvement of claim 1, wherein providing said overlayer of laser light reflective material is carried out using material composed of aluminum, molybdenum or titanium.

5. The improvement of claim 4, wherein providing said overlayer of laser light reflective material is aluminum having a thickness of 100 nm to 7 $\mu$m.

6. The improvement of claim 5, additionally including providing a layer of silicon dioxide beneath the overlayer of aluminum and having a thickness of 100 nm to 1 $\mu$m.

7. The method for fabricating the silicon doping test structure of claim 1, wherein the regions of the silicon to be doped are doped and annealed by pulsed laser processing.

8. A process for producing a device structure for real-time testing of silicon doping, comprising:

forming a device on a silicon wafer which includes at least one contact, depositing an oxide layer on the thus formed device, depositing an overlayer of laser light reflective material on the oxide layer, patterning the layer of laser light reflective material to form openings in at least the underlying silicon regions to be doped, and doping the silicon regions, and annealing the thus doped silicon regions using pulsed laser energy.

9. The process of claim 8, additionally including removing the overlayer and the layer of oxide.

10. The process of claim 8, wherein the doping is carried out by ion implantation.

11. The process of claim 8, wherein the doping is carried out by gas immersion laser doping, whereby the annealing is carried out during the doping of the silicon.

12. The process of claim 8, wherein forming the device includes providing at least one contact with an outer surface of aluminum, and wherein the patterning of the overlayer of laser light reflective material includes forming holes therein to the underlying contact.

13. The process of claim 8, wherein depositing the oxide layer is carried out using materials selected from the group of silicon dioxide, and silicon nitride.

14. The process of claim 8, wherein depositing the overlayer of laser light reflective material is carried out using materials selected from the group consisting of aluminum, molybdenum and titanium.

15. The process of claim 8, wherein the annealing is carried out using pulsed laser energy produced by a laser selected from the group of excimer lasers, YAG and copper vapor utilizing a pulse duration of 1 ns to 1 $\mu$s, energy of 0.6 to 5 J/cm$^2$, wavelength of 193 nm to 560 nm, and number of pulses from 1 to 500.

16. The process of claim 11, wherein the gas immersion laser doping is carried out by a pulsed excimer laser having a wavelength of 155 to 351 nm, energy of 0.5 to 2.5 J/cm$^2$, pulse duration of 10 to 100 ns, and number of pulses ranging from 1 to 500.

17. A process for improving silicon doping test structures, including:

providing an undoped silicon device having at least one ohmic contact therein having an aluminum surface;

depositing an oxide layer over the silicon device;

depositing an aluminum overlayer on the oxide layer, patterning the overlayer to open up holes to the at least one contact and to critical silicon regions to be doped; and doping and annealing the silicon regions.

18. The process of claim 17, wherein the doping and annealing is carried out by gas immersion laser doping.

19. The process of claim 17, wherein the doping is carried out by ion implantation, and the annealing is carried out using pulsed laser processing.

* * * * *